US005363451A

United States Patent [19]

Martinez et al.

[11] Patent Number: 5,363,451

[45] Date of Patent: Nov. 8, 1994

[54] METHOD AND APPARATUS FOR THE ACTIVE REDUCTION OF COMPRESSION WAVES

[75] Inventors: J. Raul Martinez, Sunnyvale; V. Bradford Mason, Palo Alto, both of Calif.

[73] Assignee: SRI International, Menlo Park, Calif.

[21] Appl. No.: 71,687

[22] Filed: Jun. 3, 1993

Related U.S. Application Data

[63] Continuation of Ser. No. 697,154, May 8, 1991, Pat. No. 5,224,168.

[51] Int. Cl.⁵ .............................. H03B 29/00

[52] U.S. Cl. .............................. 381/71

[58] Field of Search .............................. 381/71, 94

[56] References Cited

U.S. PATENT DOCUMENTS

| | | | |
|---|---|---|---|
| 4,122,303 | 10/1978 | Chaplin | 179/1 P |
| 4,171,465 | 10/1979 | Swinbanks | 179/1 P |
| 4,449,235 | 5/1984 | Swigert | 381/71 |
| 4,473,906 | 9/1984 | Warnaka | 381/71 |
| 4,480,333 | 10/1984 | Ross | 381/71 |
| 4,562,589 | 12/1985 | Warnaka | 381/71 |
| 4,589,133 | 5/1986 | Swinbanks | 381/71 |
| 4,596,033 | 6/1986 | Swinbanks | 381/71 |
| 4,637,048 | 1/1987 | Swinbanks | 381/71 |
| 4,654,871 | 3/1987 | Chaplin et al. | 381/72 |
| 4,665,549 | 5/1987 | Eriksson | 381/71 |
| 4,669,122 | 5/1987 | Swinbanks | 381/71 |
| 4,677,676 | 6/1987 | Eriksson | 381/71 |
| 4,677,677 | 6/1987 | Eriksson | 381/71 |
| 4,689,821 | 8/1987 | Salikuodin | 381/71 |
| 4,715,559 | 12/1987 | Fuller | 244/1 N |
| 4,736,431 | 4/1988 | Allie et al. | 381/71 |
| 4,783,817 | 11/1988 | Hamada et al. | 381/71 |
| 4,808,863 | 2/1989 | Andersson | 310/51 |
| 4,811,309 | 3/1989 | Eriksson | 367/140 |
| 4,815,139 | 3/1989 | Eriksson | 381/71 |
| 4,829,590 | 5/1989 | Ghose | 455/63 |
| 4,837,834 | 6/1989 | Allie | 381/71 |
| 5,091,953 | 2/1992 | Tretter | 381/71 |
| 5,133,017 | 7/1992 | Cain et al. | 381/71 |
| 5,140,640 | 8/1992 | Graupe et al. | 380/71 |
| 5,216,721 | 6/1993 | Melton | 381/71 |

FOREIGN PATENT DOCUMENTS

| | | | |
|---|---|---|---|
| WO88/02912 | 4/1988 | WIPO . | |
| 8900746 | 7/1988 | WIPO | G10K 11/16 |

OTHER PUBLICATIONS

ICASSP 90 by Weeks, "A Real-Time, Multi-Channel System with Parallel Digital Signal Processors," Apr. 3-6, 1990, pp. 1787-1790.

*Primary Examiner*—Forester W. Isen
*Attorney, Agent, or Firm*—Hickman & Beyer

[57] ABSTRACT

An apparatus for reducing noise characterized by a number of input microphones arranged near an undesired noise source, a signal processor coupled to the input microphones and operative to develop a number of output signals from the input signals, and a number of speakers coupled to the output signals of the signal processor to produce anti-noise within a designated quiet zone. Each of the speakers derives a portion of its signal from each of the input microphones so that each output transducer has the maximum amount of information concerning the noise to be canceled. The method of the invention is characterized by the steps of detecting compression waves at a number of detection locations within a medium, and developing a number of complementary signals utilizing all of the detected compression wave information.

19 Claims, 7 Drawing Sheets

Figure 1a (PRIOR ART)
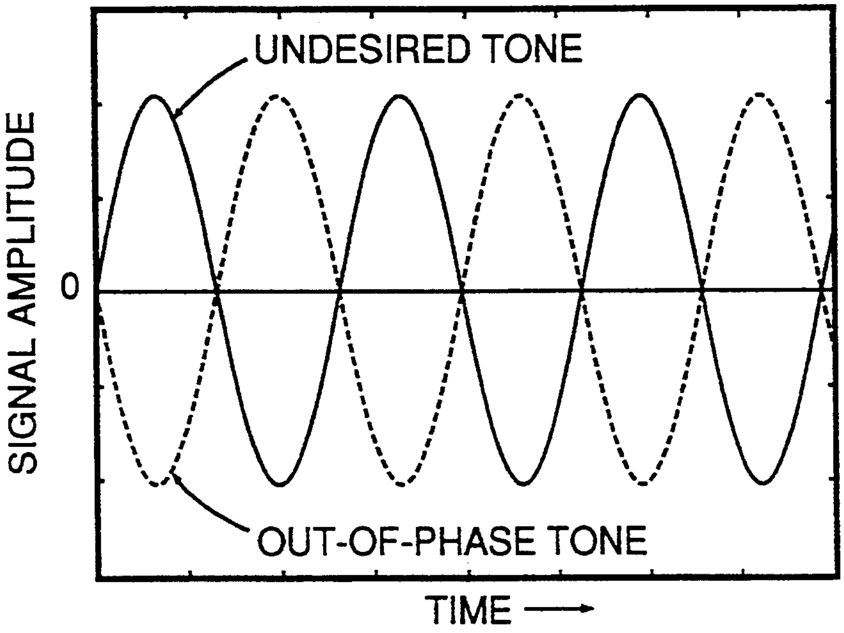
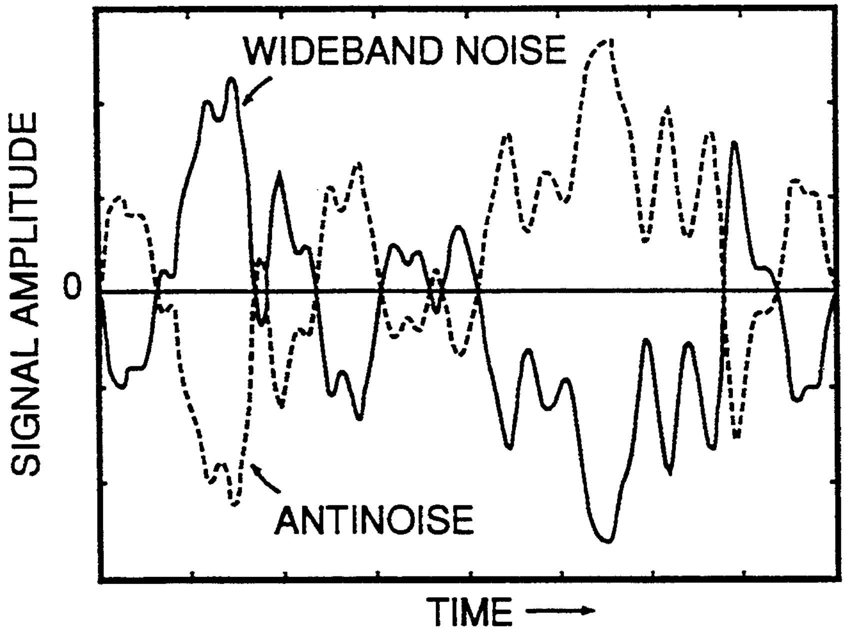
Figure 1b (PRIOR ART)

Figure 6a
APPARATUS 10 OFF
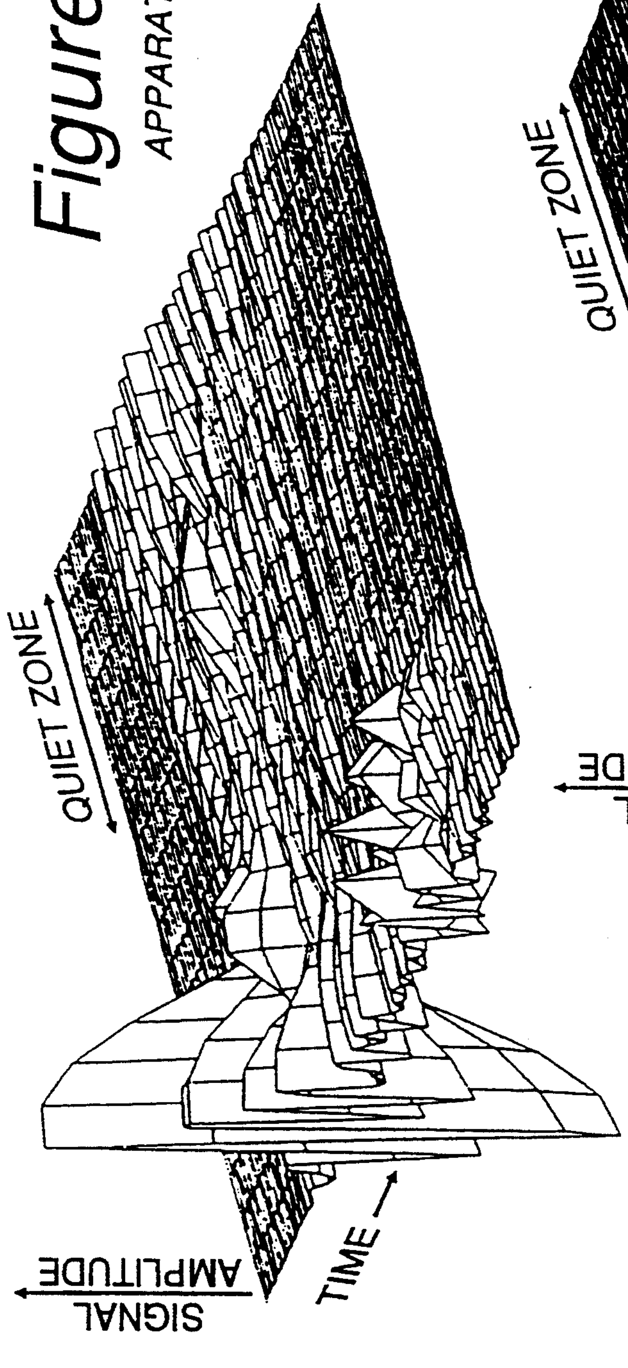
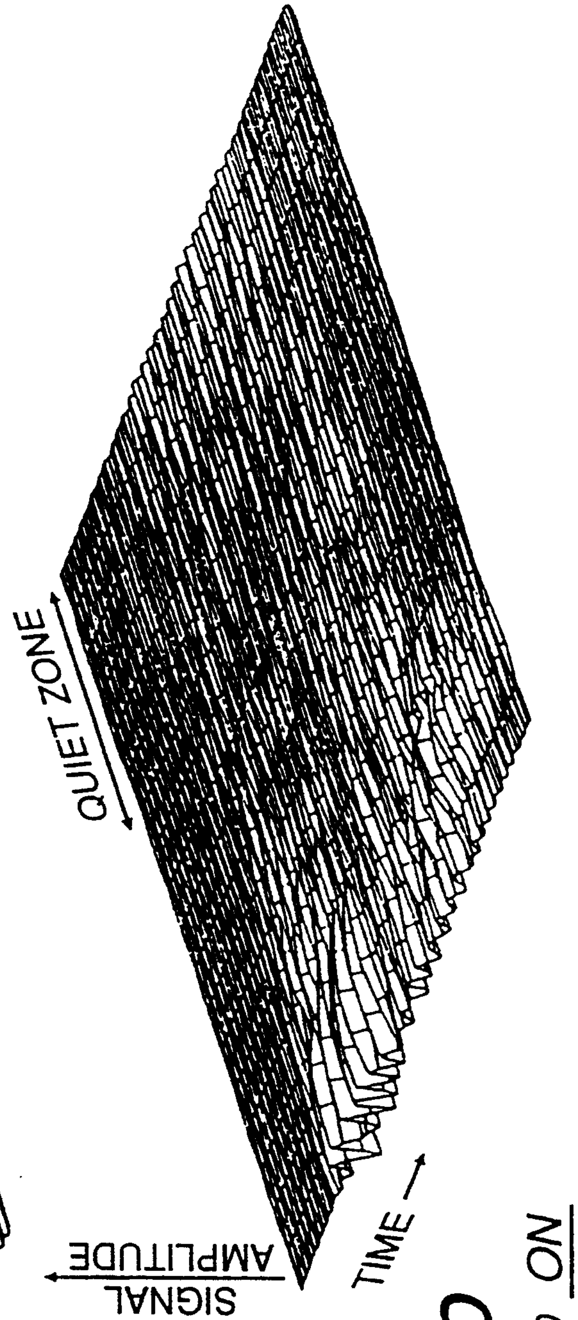
Figure 6b
APPARATUS 10 ON

METHOD AND APPARATUS FOR THE ACTIVE REDUCTION OF COMPRESSION WAVES

ORIGIN OF THE INVENTION

The U.S. Government has certain rights in this invention pursuant to Contract No. N00014-88-C-0584 awarded by the Office of Naval Research, Department of Defense.

This application is a continuation of U.S. patent application Ser. No. 07/697,154, filed May 8, 1991, now U.S. Pat. No. 5,224,168.

BACKGROUND OF THE INVENTION

The invention relates generally to sound dampening techniques and more particularly to methods and apparatus for active noise cancellation.

It is often desirable to reduce the ambient noise level in a particular environment. This is particularly true when the noise is loud and unpleasant, such as the noise produced by machinery. In fact, loud noise can be more than annoying; at certain sustained levels it can cause pain and permanent injury.

Generally speaking, prolonged exposure to noise levels below about 70 decibels (dB) is perfectly sustainable to most people. When the noise level is within the range of about 70 to 90 decibels, most people will begin to experience irritation and stress. Sustained exposure to noise in the range of 90 to 120 dB can cause permanent hearing loss, and exposure to noise much in excess of 120 dB can reach the threshold of pain for most people.

The classical approach to noise reduction is to block the compression wave generated by the sound source with a sound absorbing substance. This type of noise reduction is known as passive noise reduction because it does not require an external energy source to accomplish its task. Examples of passive noise reduction include standard automobile mufflers, enclosures for noisy machinery and acoustical ceiling tile. Passive noise reduction tends to be more effective for high frequency noise than for low frequency noise.

Another approach to noise reduction is active sound reduction, which refers to any electro-acoustical method in which an undesired sound wave is canceled by a second sound wave that has the same amplitude but is 180° out of phase. As shown in FIG. 1*a*, an undesired tone can be canceled by generating a second tone of the same amplitude and frequency, and adjusting its phase so that the peaks of one tone coincide with the valleys of the other. FIG. 1*b* illustrates the cancellation of wideband noise, such as that generated by an automobile, by an appropriately generated anti-noise. In practice, active noise reduction is most often used to attenuate low frequency noise and vibration and, therefore, tends to be complementary with passive noise reduction techniques. It is well known that active and passive noise reduction methods can be used together to attenuate a variety of wideband noise sources.

Active noise reduction research dates back at least as far as the 1930's. In the early days of the research success was limited by the available technology which essentially consisted of vacuum-tube-based analog circuitry. Signal processing errors caused by the inherent instability of the analog circuitry made it difficult to produce the correct anti-noise, thereby greatly limiting the effectiveness of the noise reduction. The development of semiconductor-based digital signal processing in the late 1960's provided new tools for analyzing sound waves and allowed sufficient control over the anti-noise signal to achieve moderate levels of noise reduction. Virtually all commercially available active noise reduction equipment is now based upon digital signal processing technology.

Prior art commercial applications of active noise reduction are concentrated in the areas of headsets and in the quieting of noise in heating, ventilation and air conditioning (HVAC) ducts. For example, headsets which utilize the principles of active noise reduction are manufactured by Bose Company of Framingham, Mass. Devices for quieting HVAC ducts are made by Digisonix/Nelson Industries of Stoughton, Wis.

The commercial products mentioned above have a number of characteristics in common. Firstly, all of the commercially available products cancel noise within an enclosure, chamber or waveguide. In the case of headsets, the chamber is defied as the volume of air enclosed by the earpieces of the headsets and the ears of the persons wearing the headsets. In HVAC applications the noise to be reduced propagates inside of an enclosed duct. Secondly, all commercially available active noise reduction products are single-channel devices which operate on sound waves traveling along a single path. Commercially available products are not, therefore, well adapted to provide effective noise reduction in environments which support complex multiple wavefronts, such as within large enclosures or in open spaces.

There are a great number of patent disclosures describing active noise cancellation systems. Examples of patents describing active noise cancellation methodologies for HVAC ducts include: U.S. Pat. Nos. 4,122,303; 4,171,465; 4,473,906; 4,480,333; 4,596,033; 4,665,549; 4,669,122; 4,677,676; 4,677,677; 4,783,817; 4,815,139; and 4,837,834. Some of these patents, such as U.S Pat. Nos. 4,473,906 and 4,665,549, disclose the use of multiple input microphones to detect the noise to be canceled. Others of these patents, such as U.S. Pat. Nos. 4,171,465 and 4,669,122 disclose multiple speakers used to cancel noise in a duct. U.S. Pat. No. 4,815,139 discloses both the use of multiple input microphones to sense noise and multiple speakers to cancel noise in a duct. Other examples of active noise cancellation patents include U.S. Pat. No. 4,637,048 which teaches the cancellation of noise from an automobile tail pipe, and U.S. Pat. Nos. 4,562,589, 4,689,821 and 4,715,559 which teach the cancellation of noise in the fuselage or cockpit of aircraft.

These patents share the same limiting characteristics as the above-mentioned commercial products: they all operate on noise within enclosed spaces such as ducts or airplane fuselages, and they all disclose single-channel cancellation devices. Even the patents which disclose multiple input microphones and/or multiple output speakers are single-channel devices in that the signals obtained from the multiple input microphones and the signals delivered to the multiple speakers are processed within a single-channel processing device. In consequence, prior art active noise cancellation devices are not well adapted to the creation of large quiet zones in open spaces or in large enclosed spaces.

SUMMARY OF THE INVENTION

The present invention includes a method and an apparatus for the active reduction of complex noise and other compression waves in essentially unrestricted environments. This is accomplished by a combination of multi-channel noise reduction techniques coupled with novel signal processing methods.

The apparatus of the present invention includes a number of microphones placed within a medium, a multi-channel signal processor, and at least one speaker or the equivalent placed within the medium to produce complementary waves that have the same amplitude but opposite phase as the compression waves to be reduced. For many applications, a number of speakers are used to produce waves at a variety of locations within the medium that combine to produce complementary waves which at least partially cancel the undesired compression waves over a large region of space known as the "quiet zone."

The signal processor includes a number of forward filters, each of which has an input coupled to one of the microphones and an output coupled to one of the speakers. Preferably, each of the speakers is coupled to each of the microphones by at least one unique forward filter such that the signal processor is a multi-channel processor having a number of channels equal to the product of the number of microphones and the number of speakers.

The apparatus also includes a number of neutralization filters where the input of each of the neutralization filters is coupled to one of the inputs to the speakers and where the outputs of the feedback filters are combined with the input signals from the microphones. The purpose of the neutralization filters is to compensate for the acoustic feedback that inevitably occurs whenever speakers and microphones are in close proximity. Preferably, each of the outputs to the speakers is filtered and combined with each of the input signals from the microphones so that the number of neutralization filters equals the number of forward filters.

The method of the present invention includes developing a number of compression signals from compression waves detected at a number of locations within a medium, processing the compression signals to develop at least one complementary signal, and producing at least one complementary compression wave from the complementary signal. Again, it is preferable to develop a number of complementary signals and complementary compression waves in the medium for more effective cancellation of the compression waves.

An advantage of providing multi-channel noise reduction is that it is far more effective than the single-channel methods of the prior art at attenuating noise in unbounded environments or in large enclosed spaces. This and other advantages of the present invention will become clear to those skilled in the art upon a study of the detailed description of the invention and of the several figures of the drawings.

BRIEF DESCRIPTION OF THE DRAWINGS

FIG. 1*a* is a graph illustrating the concept of canceling an undesired first tone with a second tone which is 180° out of phase with the first tone, as it is known in the prior art.

FIG. 1*b* is a graph illustrating the concept of canceling wideband noise with a 180° out-of-phase anti-noise, as it is known in the prior art.

FIG. 5 is a graph of the signal level versus frequency of the noise with the apparatus turned OFF and the apparatus turned ON.

FIGS. 6*a* and 6*b* are three-dimensional depictions which include the graphical information of FIGS. 4*a* and 5 in FIG. 6*a* and FIGS. 4*b* and 5 in FIG. 6*b*.

DETAILED DESCRIPTION OF THE PREFERRED EMBODIMENTS

FIGS. 1*a* and 1*b* illustrate the concept of active noise cancellation as was discussed in the background section. As used herein, "noise" means any undesired compression wave produced in any medium, be it solid, liquid, or gaseous, and in any frequency range, including the sonic, subsonic and supersonic ranges.

Figure 2B:
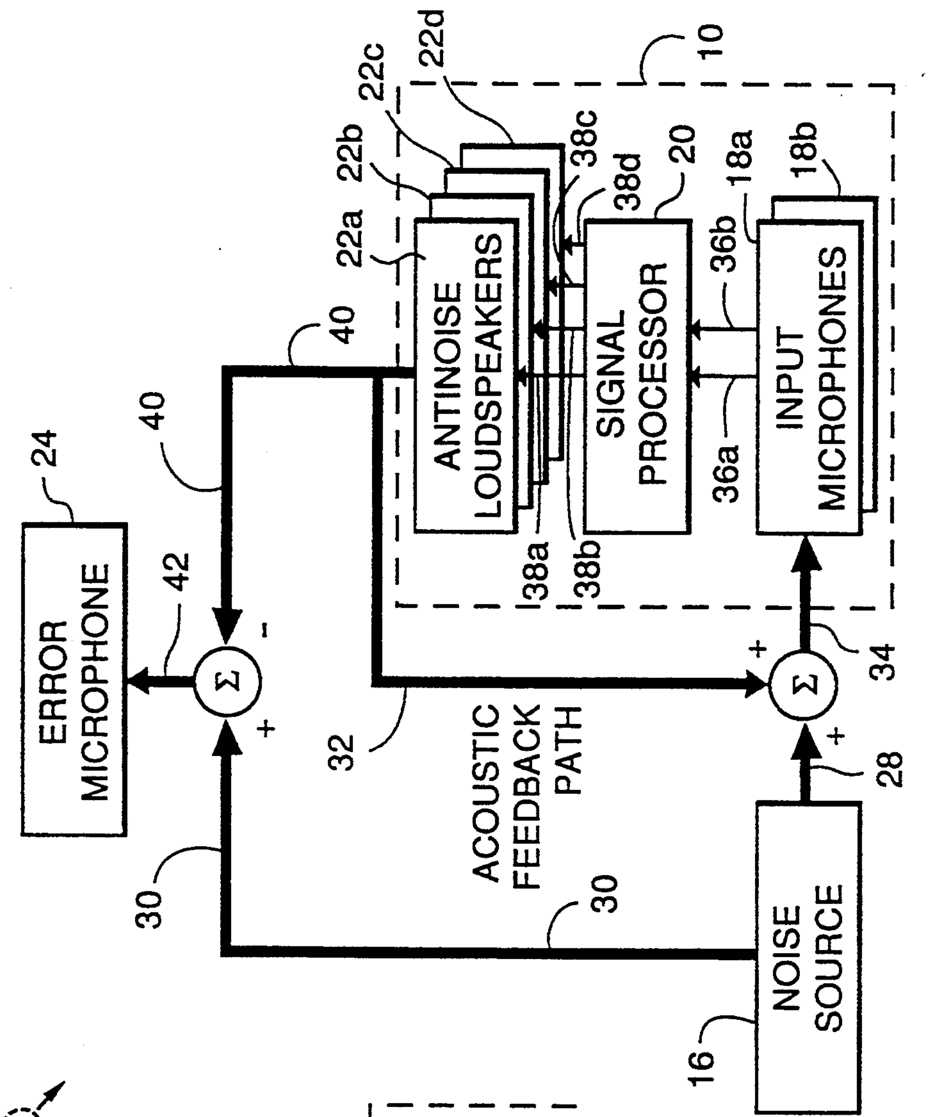
FIG. 2*b* is a block diagram of the apparatus and its environment as it is pictorially illustrated in FIG. 2*a*.
Figure 2A:
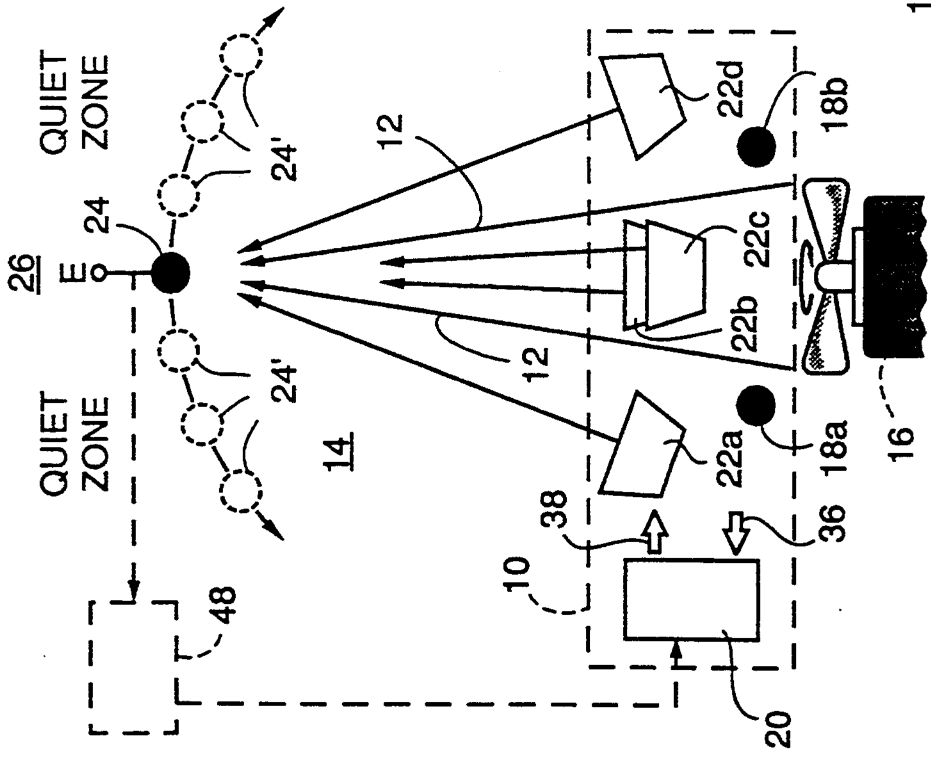
FIG. 2*a* is a pictorial, in-situ representation of an apparatus in accordance with the present invention.

In FIG. 2*a*, an apparatus 10 in accordance with the present invention is used to reduce undesired compression waves 12 in a medium 14 produced by a noise source 16. The apparatus 10 includes a number of input microphones such as microphones **18*a* and 18*b*, a signal processor 20, and a number of speakers such as speakers 22*a*, 22*b*, 22*c*, and 22*d*. As used herein, the term "speaker" means any electro-acoustical transducer, such as a loudspeaker, a piezoelectric transducer, etc. An error microphone 24 can be used to detect the effectiveness of the apparatus 10 in reducing the undesired compression waves in a quiet zone 26 of the medium 14. The error microphone 24 can be moved to a number of positions 24' to sample the effectiveness of the apparatus 10 at various angular positions relative to the noise source 16**. Alternatively, a number of error microphones can be used to simultaneously sample the noise field in the quiet zone.

FIG. 2*b* illustrates the system of FIG. 2*a* in a block diagram form. The fluid medium 14, in this example, is air, and acoustic paths through the medium 14 are indicated by arrows drawn in a heavy line. Electrical paths within the apparatus 10 between the input microphones **18*a*–*b*, signal processor 20, and speakers 22*a*–*d*** are indicated with arrows drawn in a finer line.

The noise source 16 develops noise wavefronts which travel along a number of paths such as the acoustic paths 28 and 30. The wavefront along acoustic path 28 combines with acoustic feedback from speakers **22*a*–*d* along an acoustic path 32 and impinge upon input microphones 18*a*–*b* along an acoustic path 34. The input microphones 18*a*–*b* serve as transducers to convert the compression waves on acoustic path 34 to electrical signals ("compression signals") on lines 36*a* and 36*b*. The signal processor 20 processes the electrical signals on lines 36*a*–*b* to produce electrical signals ("complementary signals") on lines 38*a*, 38*b*, 38*c* and 38*d*. The speakers 22*a*–*d* produce complementary compression waves in medium 14, part of which are fed back along acoustic path 32 and part of which travel along an acoustic path 40. The compression waves on acoustic paths 30 and 40 are combined in the fluid medium 14** and travel on an acoustic path 42 to impinge upon error microphone 24.

Figure 3:
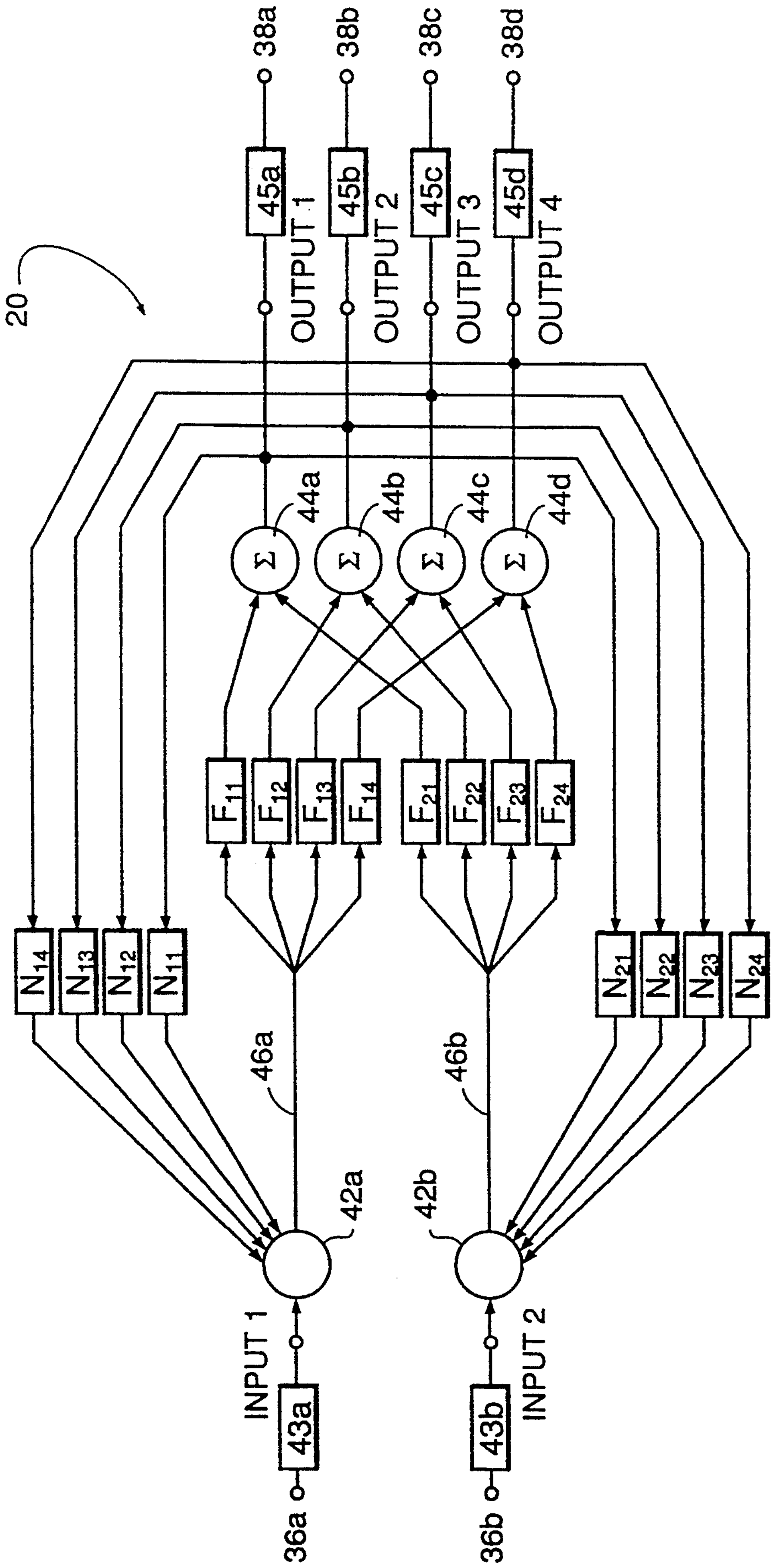
FIG. 3 is a schematic of a preferred embodiment for a signal processor of FIGS. 2*a* and 2*b*.

Referring now to FIG. 3, the signal processor 20 includes a pair of input summers 42*a* and 42*b*, eight forward filters F, four output summers 44*a*, 44*b*, 44*c*, and 44*d*, and eight neutralization filters N. The two-digit subscripts of the forward filters F are determined by inputs and outputs they couple together. For example, forward filter $F_{11}$ couples input 1 to output 1 and forward filter $F_{23}$ couples input 2 to output 3. In other words, the first digit of the subscript of the forward filters F indicates the input number it is attached to and the second digit of the subscript of the forward filters indicates which output it is coupled to. In a similar fashion, the eight neutralization filters have two-digit subscripts where the first digit indicates which input it is coupled to and the second digit indicates which output it is coupled to. The signal processor 20 further includes a pair of input buffers 43*a* and 43*b* coupling lines 36*a* and 36*b* to summers 42*a* and 42*b*, respectively, and four output buffers 45*a*, 45*b*, 45*c*, and 45*d* coupling the outputs of summers 44*a*–44*d* to lines 38*a*–38*d*, respectively.

In the forward path of signal processor 20, the inputs 1 and 2 are processed within summers 42*a* and 42*b*, respectively, and the output of summers 42*a* and 42*b* are each applied to the inputs of four forward filters F. The output of summer 42*a* on a line 46*a* is applied to the inputs of forward filters $F_{11}$, $F_{12}$, $F_{13}$, and $F_{14}$. Similarly, the output of summer 42*b* on a line 46*b* is applied to the inputs of the forward filters $F_{21}$, $F_{22}$, $F_{23}$, and $F_{24}$. The outputs of the forward filters F are applied to the inputs of summers 44*a*–*d* in the following fashion: the outputs of filters $F_{11}$, and $F_{21}$ are applied to summer 44*a*, the outputs of filters $F_{12}$ and $F_{22}$ are applied to summer 44*b*, the outputs of filter $F_{13}$ and $F_{23}$ are applied to summer 44*c*, and the outputs of filters $F_{14}$ and $F_{24}$ are coupled to the inputs of the summer 44*d*. The outputs of the summers 44*a*–*d* are coupled to the lines 38*a*–38*d* by the output buffers 45*a*–*d*, respectively.

In a reverse or feedback path, the output signals 1–4 are fed back through neutralization filters N to the summers 42*a* and 42*b*. More specifically, neutralization filters $N_{11}$, $N_{12}$, $N_{13}$, and $N_{14}$ feed back the signals from outputs 1–4 to the summer 42*a* and neutralization filters $N_{21}$, $N_{22}$, $N_{23}$, and $N_{24}$, feed back the signals from outputs 1–4 to the summer 42*b*.

The filters F and N can be made from discrete components such as inductors, capacitors and resistors. Preferably, however, the filters F and N are digital filters and part of a digital signal processing apparatus 20. The best mode currently known for practicing this invention utilizes a mini-computer, such as a VAX 3600 mini-computer from Digital Equipment Corporation, and digital signal processing (DSP) boards which plug into bus slots provided in the mini-computer. A typical DSP board uses commercially available DSP integrated circuits such as I.C. part DSP-32 of AT&T, Inc. or I.C. part number 56000 of Motorola, Inc. The architecture of a suitable DSP board is described in a paper entitled "A Real-Time, Multichannel System with Parallel Digital Signal Processors" by William A. Weeks and Brian L. Curless, published in the Proceedings of the 1990 International Conference on Acoustics, Speech, and Signal Processing (ICASSP 90), Albuquerque, N. Mex., Apr. 3–6, 1990. Alternatively, a less powerful system uses a personal computer such as a Macintosh II personal computer available from Apple Computers, Inc. of Cupertino, Calif. equipped with commercially available DSP boards from such vendors as Spectral Innovations, Inc. of Santa Clara, Calif.

In a digital signal processing system 20, the input buffers 43*a*–*b* include analog-to-digital (A/D) converters which convert the analog signals produced by the input transducers on lines 36*a*–*b* into digital inputs 1 and 2, respectively. As is well known to those skilled in the art, the input buffers can also include pre-amplifiers, anti-aliasing (low-pass) filters, etc. Lines 46*a* and 46*b* couple the digital sum calculated by the digital summers 42*a* and 42*b* to the digital forward filters F. The outputs of the digital forward filters are coupled to the inputs of the digital summers 44*a*–*d* to produce digital outputs 1–4. The output buffers 45*a*–*d* include digital-to-analog (D/A) converters to convert the digital outputs 1–4 to the analog signals on line 38*a*–38*d* to drive the output transducers. As is also well known to those skilled in the art, the output buffers can include reconstruction filters, power amplifiers, etc. The digital outputs on output 1–4 are fedback through digital neutralization filters N to produce digital inputs for digital summers 42*a* and 42*b*.

The method of computing the "weights" of the forward filters F and neutralization filters N will be described with reference to FIG. 2*a*. The error microphone 24 produces an error signal E having an amplitude which is directly related to the amount of uncancelled noise at that location. The object, therefore, is to minimize the amplitude of the error signal E by adjusting the weights of the forward filters F and neutralization filters N so as to produce the most effective anti-noise. The filter weights can be adjusted by a variety of methods well known to those skilled in the art, such as the Wiener least-squares minimization method as taught in *Optimum Signal Processing, An Introduction*, by S. J. Orfanidis, Macmillan Publishing Company, 1988, or the Widrow-Hoff algorithm as taught in *Adaptive Signal Processing*, by B. Widrow and S. Stearns, Prentice-Hall, Inc., 1985.

Once the noise at error microphone 24 has been minimized, the microphone can be moved to a variety of locations 24' to detect the effectiveness of sound cancellation at those locations. The filters can then have their weights further adjusted to, for example, minimize the average simultaneous noise power at all of the tested locations.

It should be noted that the apparatus 10 will work in a number of environments and mediums. For example, the apparatus 10 can be used to reduce compression waves within a liquid medium for such purposes as underwater noise cancellation to aid in the sonic exploration of the oceans. As another example, the apparatus 10 can be used to selectively cancel seismic waves propagating through the earth's crust so that other compression wave activity in the earth's crust can be monitored more sensitively. Of course, the input and output transducers of the apparatus 10 are chosen to be suitable for the environment that they will be subjected to. For example, in a liquid medium where both the input and output transducers are immersed in a liquid the transducer should be waterproof and relatively inert to that liquid. Of course, if one of the transducers, such as the output transducer, is outside of the liquid medium, this would not be a concern. In a solid medium the input transducer might be a vibration sensor such as a piezoelectric crystal or magnetic coil detector while the output transducers might be vibration-creating elements such as electrical, pneumatic, or hydraulic rams or solenoids.

Figure 4A:
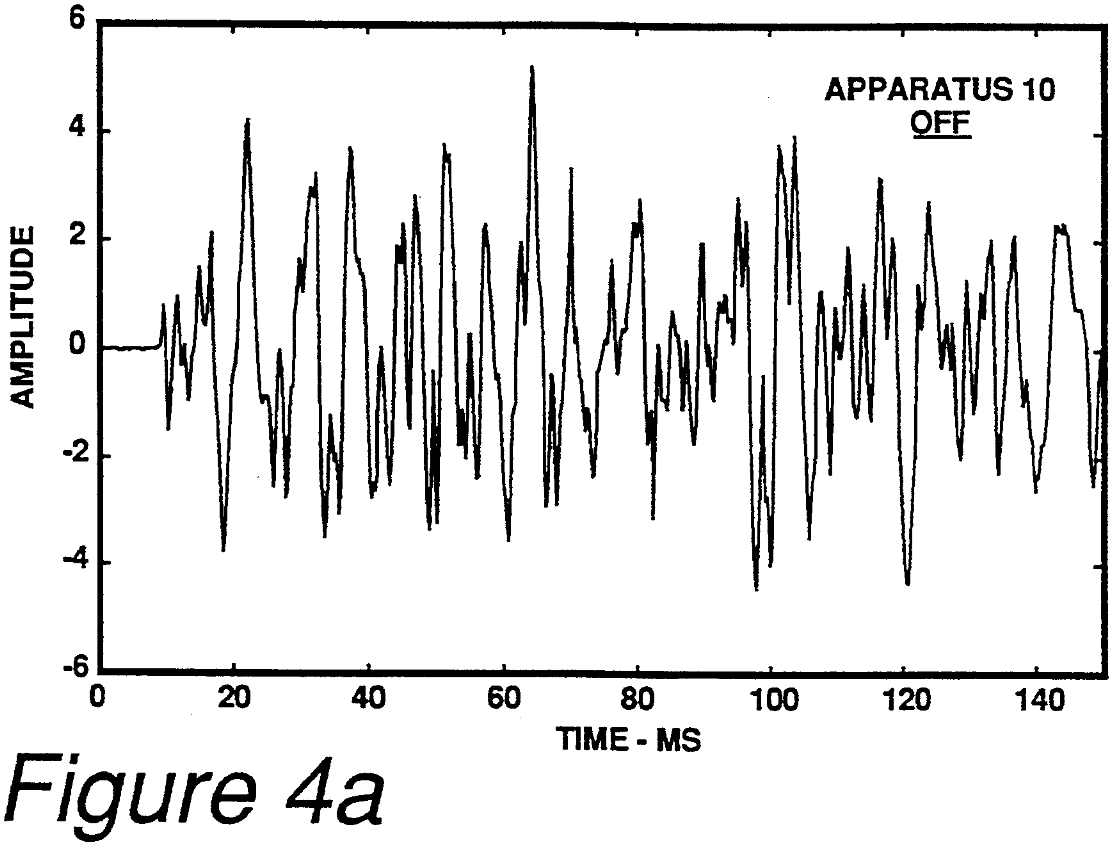
FIGS. 4*a* and 4*b* are graphs illustrating the noise level at a location within a desired quiet zone with the apparatus turned OFF and the apparatus turned ON, respectively.
Figure 4B:
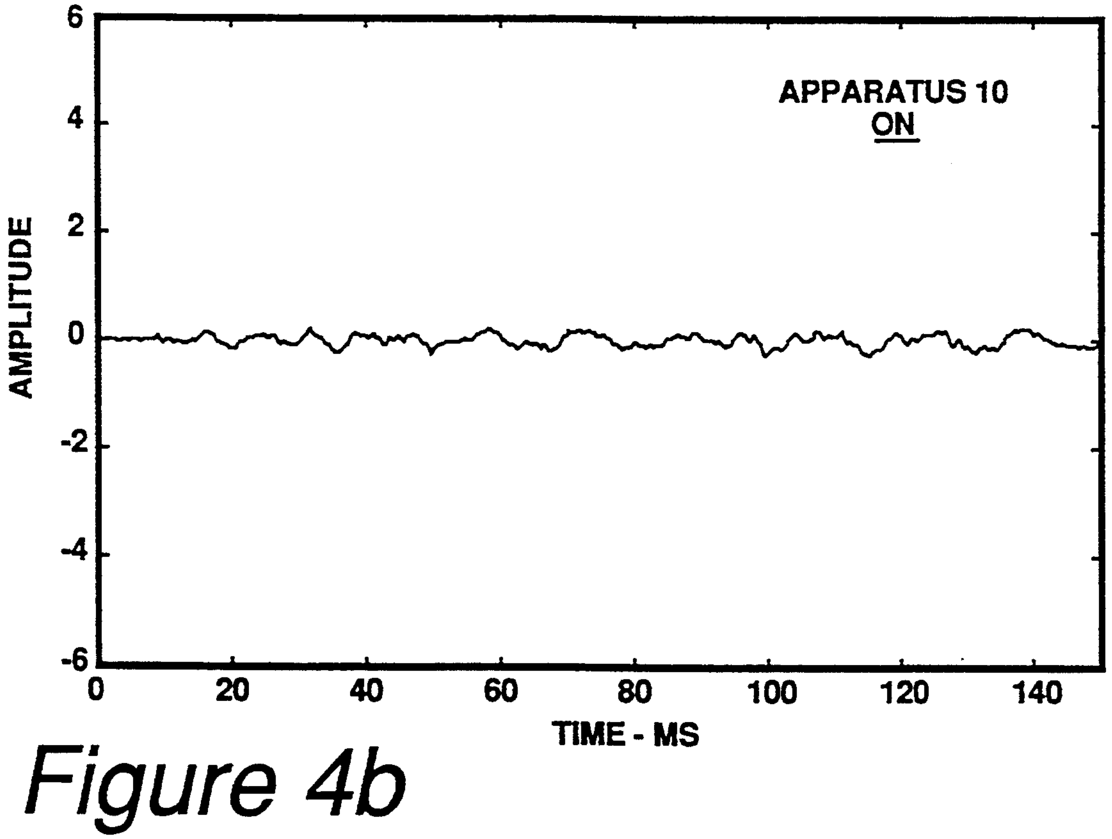

In FIGS. 4*a* and 4*b*, plots of the amplitude versus time function of the error signal E are shown. In FIG. 4*a* the apparatus 10 is turned OFF and the error signal E represents the arbitrary noise to be canceled. In FIG. 4*b* the apparatus 10 is turned 0N and the error signal E indicates that the undesired noise is quickly and substantially reduced. Under typical conditions, the apparatus 10 of the present invention has reduced the noise level by as much as 30 dB in a small fraction of a second.

Figure 5:
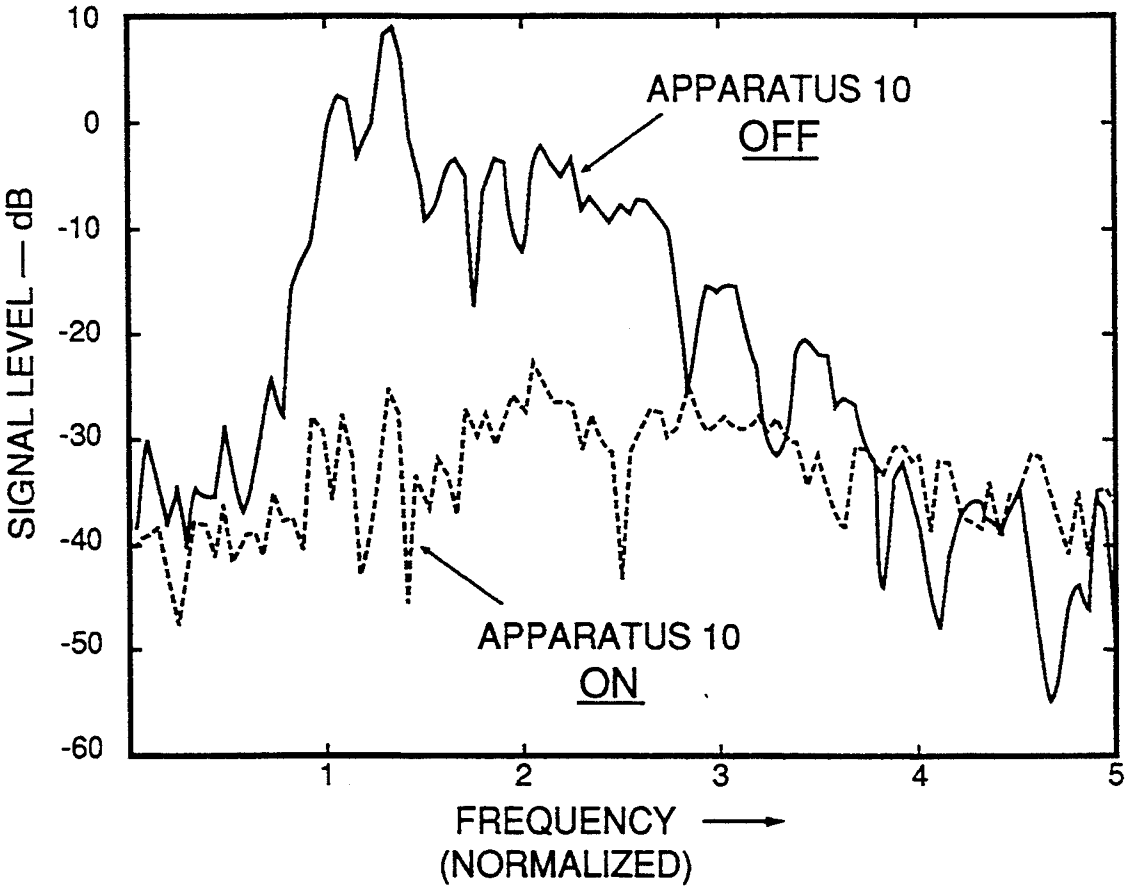

FIG. 5 illustrates the frequency-dependent behavior of the noise reduction method of the present invention. In this graph, the amplitudes of the spectral components of error signal E are taken at a particular point in space. The frequency-dependent error signal E developed when the apparatus 10 is OFF is shown with a solid line and is the spectrum of the waveform shown in FIG. 4*a*. The frequency-dependent error signal E developed when the apparatus 10 is ON is shown with a broken line and represents the spectrum of the waveform shown in FIG. 4*b*. At each frequency, the difference between the two curves of FIG. 5 represents the reduction in noise power obtained at a particular location in the quiet zone. As can be seen, the reduction varies with frequency, reaching 30 dB or more at some frequencies. In FIG. 5, the operating bandwidth of the apparatus 10 extends from about 0.1–1.5 kilohertz.

FIG. 6*a* is a three-dimensional plot that illustrates how a typical noise field is distributed in time and space when the apparatus 10 is turned OFF. FIG. 6*b* is a three dimensional plot that illustrates the residual noise in the quiet zone after the apparatus 10 is turned ON. As can be seen, the apparatus 10 achieves a substantial noise reduction within the quiet zone.

Figure 7:
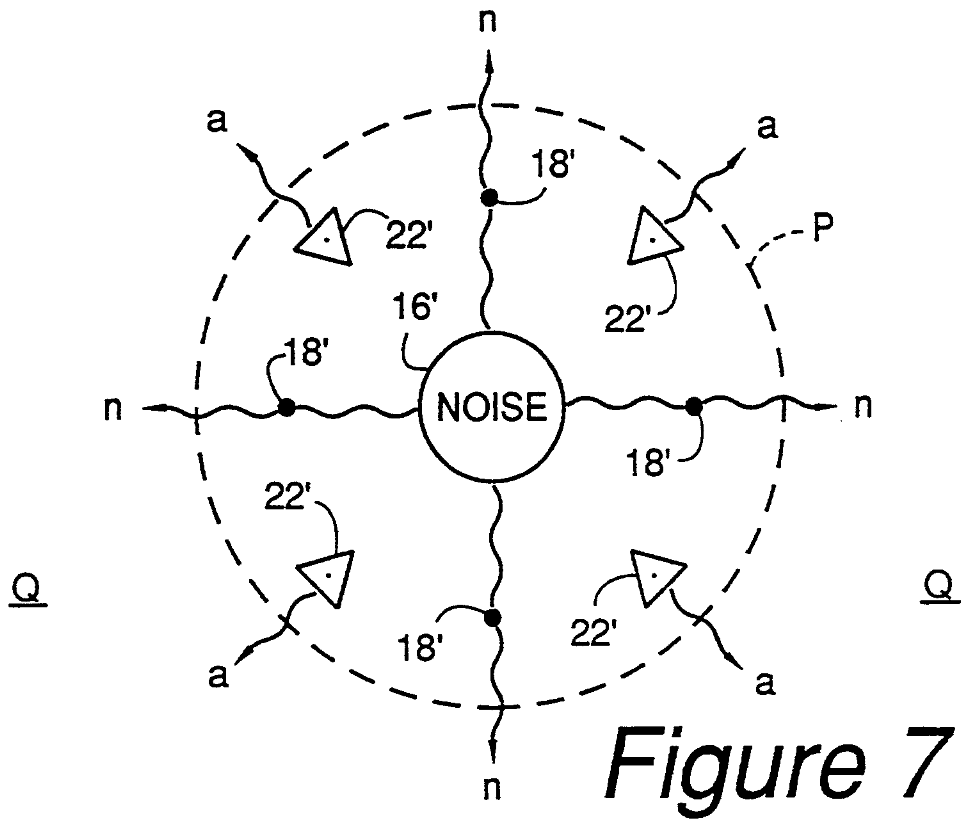
FIG. 7 illustrates the use of the apparatus of the present invention to provide omni-directional noise control in an unbounded medium.
Figure 8:
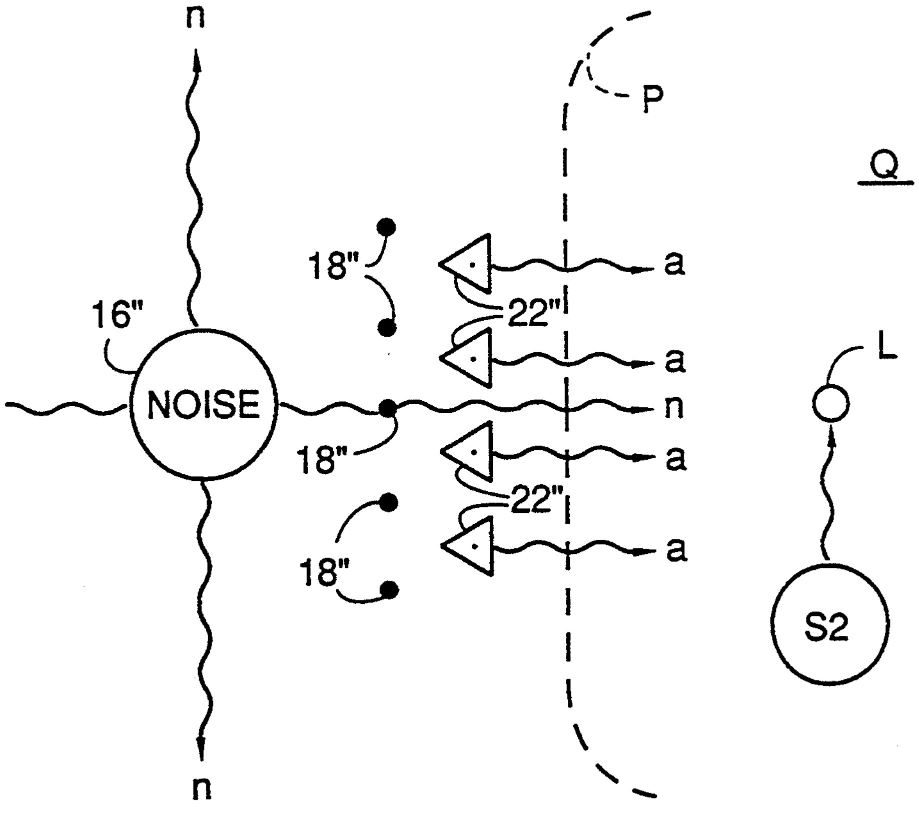
FIG. 8 illustrates the use of the present apparatus to provide directional noise control in a portion of an unbounded medium.

FIGS. 7 and 8 illustrate two of the many ways of positioning the transducers of the apparatus 10 of the present invention in a medium to achieve different objectives. In FIG. 7, the input transducers 18′ and the output transducers 22′0 are arranged concentrically around a noise source 16′. A quiet zone Q begins at some distance beyond the output transducers 22′, as indicated by a circle P (shown in broken line). In this arrangement, the transducers 18′ are arranged in a plane parallel to a support surface so that apparatus 10 produces a 2-dimensional quiet zone where the noise n produced by noise source 16′ is effectively canceled by the anti-noise a produced by output transducers 22′. Alternatively, 3-dimensional transducer arrangements can be used to create a 3-dimensional quiet zone Q.

In FIG. 8, input transducers 18″ and output transducers 22″ are arranged in parallel rows to one side of a noise source 16″. A boundary of the quiet zone Q is defined by a perimeter curve P and, although partially bounded, the quiet zone Q extends indefinitely in a direction away from the noise source 16″. This arrangement will reduce noise from source 16″ in one general direction rather than omni-directionally, as was the case with the arrangement described with reference to FIG. 7. FIG. 8 also shows an observer location L and a second noise source S2 within the quiet zone Q. At the observer location L, noise from the source 16″ will be reduced while noise emanating from the second source S2 will be unaffected.

In many applications, the acoustical environment in which the system operates will vary over time. In addition, system components, such as the transducers, tend to vary over time. Therefore, filter weights computed at one point in time may not provide the desired noise reduction at a later time. To compensate for such time variation, the filter weights may be dynamically adjusted on the basis of information derived from continuous monitoring of system performance. For example, as illustrated in FIG. 2*a*, an error transducer 24 can be permanently placed within quiet zone 26 to continuously monitor residual noise. The error signal E can then be input into a processor 48 to produce new filter weights for the forward filters F and the neutralization filters N of signal processor 20 to optimize noise reduction under the new acoustical conditions.

While this invention has been described in terms of several preferred embodiments, it is contemplated that various alterations and permutations thereof will become apparent to those skilled in the art. It is therefore intended that the appended claims include all such alterations and permutations as fall within the true spirit and scope of the present invention.

What is claimed is:

1. An apparatus for reducing undesired compression waves in a quiet zone of a medium comprising:

a plurality of input transducers positioned externally to a quiet zone of a medium which are sensitive to undesired compression waves before they enter said quite zone, said plurality of input transducers being operative to produce a plurality of input signals in response thereto;

a signal processor responsive to said plurality of input signals and operating in an open-loop fashion with a predetermined transfer function that is unaffected by an input from a transducer within said quiet zone to produce at least one output signal which is derived at least in part by independently processing with said predetermined transfer function more than one of said plurality of input signals; and an output transducer responsive to said output signal and operative to produce complementary compression waves in said medium which combine with said undesired compression waves in said quiet zone.

2. An apparatus as recited in claim 1 wherein said signal processor develops a plurality of output signals and wherein said output transducer includes a plurality of transducers responsive to said plurality of output signals, where each of said plurality of output signals is derived from more than one input signal, said plurality of output transducers being positioned between said plurality of input transducers and said quiet zone.

3. An apparatus as recited in claim 1 wherein said signal processor further includes a feedback reducer to reduce feedback between said output transducers and said input transducers.

4. An apparatus as recited in claim 3 wherein said feedback reducer is responsive to more than one of said output signals.

5. An apparatus for reducing noise comprising:

a plurality of input transducers exposed to an unwanted noise wavefront prior to said unwanted wavefront entering a quiet zone, said input transducers developing a plurality of input signals in response thereto;

a signal processor operating in an open-loop mode without feedback from an error microphone, said signal processor being coupled to said plurality of input transducers and being operative to develop at least one output signal which is derived from at least two of said input signals each of which is at least in part independently processed using a fixed transfer function; and an output transducer coupled to said signal processor to convert at least one output signal into a complementary anti-noise wavefront which is substantially 180° out of phase with said noise wavefront, wherein said complementary antinoise wavefront and said unwanted noise wavefront combine in said quiet zone.

6. An apparatus for reducing noise as recited in claim 5 wherein said signal processor develops a plurality of output signals each of which is derived from more than one input signal and wherein said output transducer includes a plurality of output transducers responsive to said output signals.

7. An apparatus for reducing noise as recited in claim 5 wherein said signal processor includes a plurality of channels and at least one forward filter associated with each of said plurality of channels, where each filter has an input coupled to an input signal and an output developing a portion of an output signal.

8. An apparatus for reducing noise as recited in claim 7 further comprising a first plurality of summers having inputs coupled to a plurality of said outputs of said forward filters and each having an output coupled to one of said output transducers.

9. An apparatus for reducing noise as recited in claim 8 wherein said signal processor further includes a plurality of reverse filters and a second plurality of summers, said second plurality of summers having inputs coupled to said input signals and to a plurality of said outputs of said first plurality of summers by said plurality of reverse filters, said second plurality of summers having outputs coupled to a plurality of inputs of said forward filters.

10. A method for reducing compression waves in a quiet zone of a medium comprising:

detecting compression waves at a plurality of detection locations within a medium outside of a quiet zone and producing a plurality of compression signals therefrom; and at least in part independently each of processing said plurality of compression signals in an open-loop fashion with a transfer function that is not dependent upon feedback from an error microphone in said quiet zone to develop at least one complementary signal; and producing at least one complementary compression wave from said complementary signal at at least one reduction location which combines with said compression waves in said quiet zone.

11. A method for reducing compression waves as recited in claim 10 wherein a plurality of complementary signals are developed from said plurality of compression signals in an open-loop fashion with a transfer function that is not dependent upon feedback from an error microphone in said quiet zone, and wherein a plurality of compression waves are produced from said complementary signals at a plurality of reduction locations.

12. A method for reducing compression waves as recited in claim 11 wherein each of said complementary signals is derived from each of said compression signals.

13. A method for reducing compression waves as recited in claim 11 further comprising the step of reducing the effect of feedback of said complementary compression waves by combining at least a portion of said plurality of complementary signals with at least one of said compression signals.

14. A method for the active reduction of noise in a quite zone of a medium comprising:

sensing noise within a medium outside of a desired quiet zone with a plurality of microphone means to develop a plurality of noise signals;

independently processing each of said noise signals in an open-loop fashion with a predetermined and fixed transfer function and without feedback from an error microphone in said quiet zone, and combining said noise signals to develop at least one anti-noise signal; and developing an anti-noise within said medium with a loudspeaker from said anti-noise signal such that said anti-noise combines with said noise within said quiet zone.

15. A method for the active reduction of noise in a medium as recited in claim 14 wherein a plurality of anti-noise signals are produced from said processing and combination of said noise signals in an open-loop fashion with a predetermined and fixed transfer function and without feedback from an error microphone in said quiet zone and wherein anti-noise is developed by a plurality of loud speakers within said medium in response to said anti-noise signals.

16. A method for the active reduction of noise in a medium as recited in claim 15 wherein each of said anti-noise signals is developed by the processing and combination of each of said noise signals.

17. A method for the active reduction of noise in a medium as recited in claim 15 further comprising the step of reducing feedback from said loudspeakers to said microphone means by processing and combining a plurality of said anti-noise signals with said noise signals.

18. A method for the active reduction of noise in a medium as recited in claim 17 wherein all of said anti-noise signals are processed and combined with each of said noise signals.

19. An apparatus for reducing noise comprising:

a plurality of input transducers exposed to an unwanted noise wavefront prior to said unwanted wavefront entering a quiet zone, said input transducers developing a plurality of input signals in response thereto;

signal processing means coupled to said plurality of input transducers and operative to develop at least one output signal which is derived at least in part by independently processing at least two of said input signals, where said signal processing means includes a number of channels and at least one forward filter associated with each channel, where each filter has an input coupled to an input signal and an output developing a portion of an output signal, said signal processing means further including a first plurality of summation means having inputs coupled to a plurality of said outputs of said forward filters and each having an output coupled to one of said output transducers, a plurality of reverse filters, and a second plurality of summation means, said second plurality of summation means having inputs coupled to said input signals and to a plurality of said outputs of said first plurality of summation means by said plurality of reverse filters, said second plurality of summation means having outputs coupled to a plurality of inputs of said forward filters; and output transducer means coupled to said signal processing means for converting at least one output signal into a complementary anti-noise wavefront which is substantially 180° out of phase with said noise wavefront, wherein said complementary antinoise wavefront and said unwanted noise wavefront combine in said quiet zone.

* * * * *